United States Patent
Sun

(10) Patent No.: US 8,031,092 B1
(45) Date of Patent: Oct. 4, 2011

(54) DUAL-MODE BASED DIGITAL BACKGROUND CALIBRATION OF PIPELINED ADCS FOR GAIN VARIATIONS AND DEVICE MISMATCHES

(75) Inventor: Nan Sun, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 63 days.

(21) Appl. No.: 12/649,274

(22) Filed: Dec. 29, 2009

Related U.S. Application Data

(60) Provisional application No. 61/145,163, filed on Jan. 16, 2009, provisional application No. 61/141,138, filed on Dec. 29, 2009.

(51) Int. Cl.
 *H03M 1/10* (2006.01)

(52) U.S. Cl. ........ 341/120; 341/118; 341/121; 341/155; 341/161

(58) Field of Classification Search .......... 341/118–121, 341/155, 161, 172
See application file for complete search history.

(56) References Cited

U.S. PATENT DOCUMENTS

| | | | |
|---|---|---|---|
| 5,635,937 A * | 6/1997 | Lim et al. | 341/161 |
| 6,323,800 B1 * | 11/2001 | Chiang | 341/161 |
| 6,784,814 B1 * | 8/2004 | Nair et al. | 341/118 |
| 6,967,603 B1 * | 11/2005 | Lin | 341/120 |
| 7,187,310 B2 * | 3/2007 | El-Sankary et al. | 341/120 |
| 7,663,516 B1 * | 2/2010 | Chandra | 341/120 |
| 7,786,910 B2 * | 8/2010 | Ali et al. | 341/131 |
| 2002/0175843 A1 * | 11/2002 | Sonkusale et al. | 341/120 |
| 2006/0208933 A1 * | 9/2006 | Chen et al. | 341/120 |
| 2009/0243900 A1 * | 10/2009 | Kawahito | 341/118 |

* cited by examiner

*Primary Examiner* — Linh Nguyen
(74) *Attorney, Agent, or Firm* — Rauschenbach Patent Law Group; Elizabeth Kim

(57) ABSTRACT

Methods and systems are described relating to dual-mode based digital background calibration of pipelined ADCs, for gain variations and device mismatches. Errors caused by gain insufficiency, nonlinearity, and capacitor mismatches are corrected by operating one ADC in two circuit configurations. These two modes are so arranged that their digital outputs differ in the presence of gain nonlinearity, gain insufficiency, and capacitor mismatches. The output difference is measured by randomly choosing one of the two operation modes at each sampling clock and digitally correlating the resulting digital output sequence. The measured output difference, which represents ADC errors, is used to remove the errors.

18 Claims, 10 Drawing Sheets

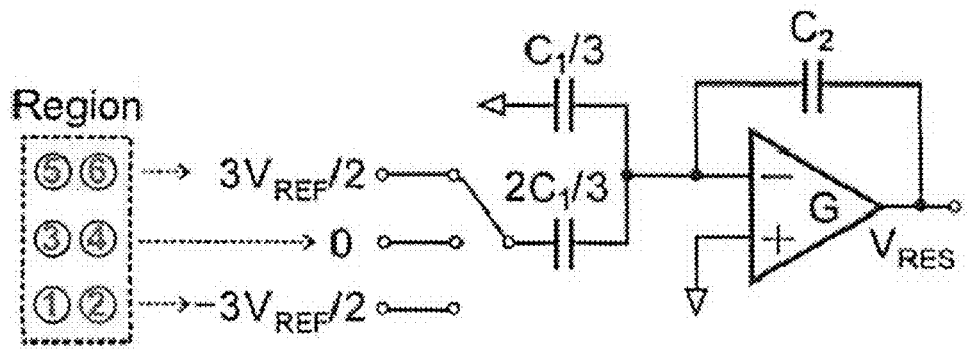
Fig. 1 (b) Charge Transfer Phase: Mode A
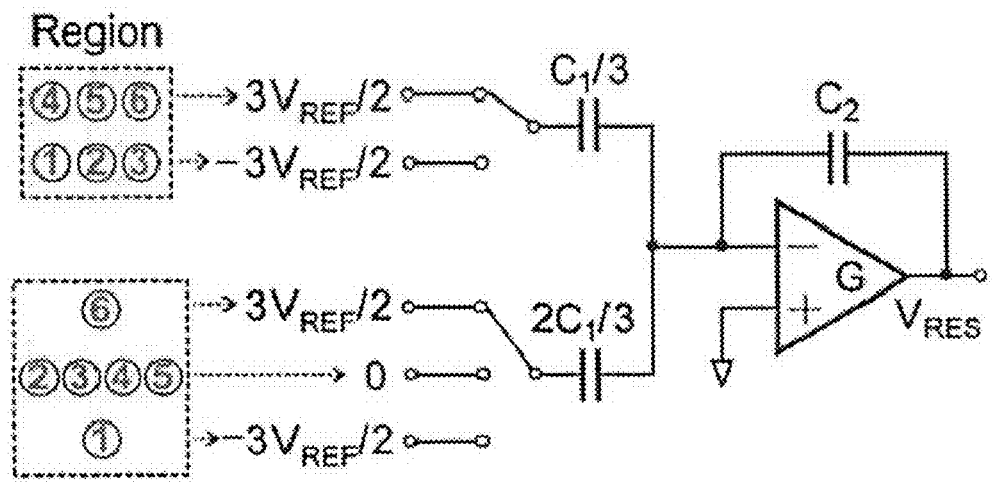
Fig. 1 (c) Charge Transfer Phase: Mode B

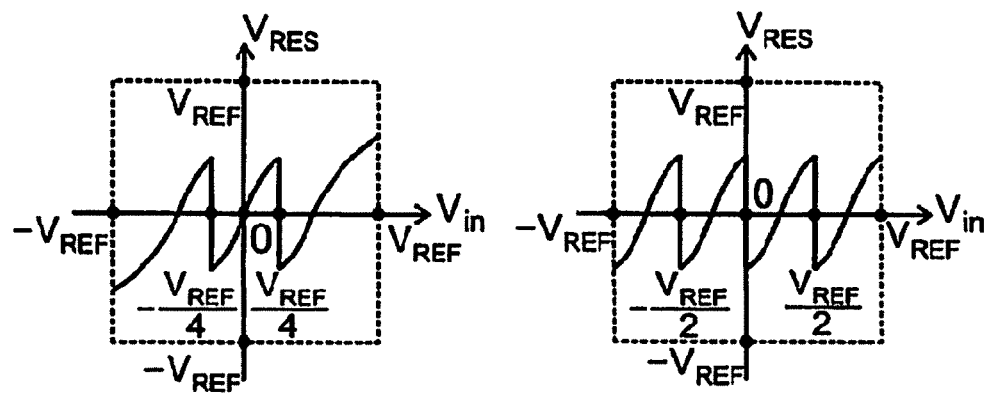
Figure 2 (a) Mode A    Figure 2 (b) Mode B

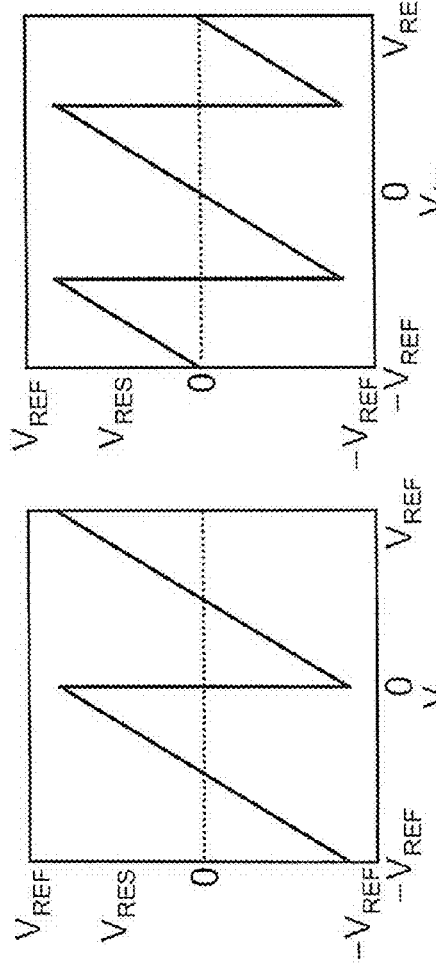
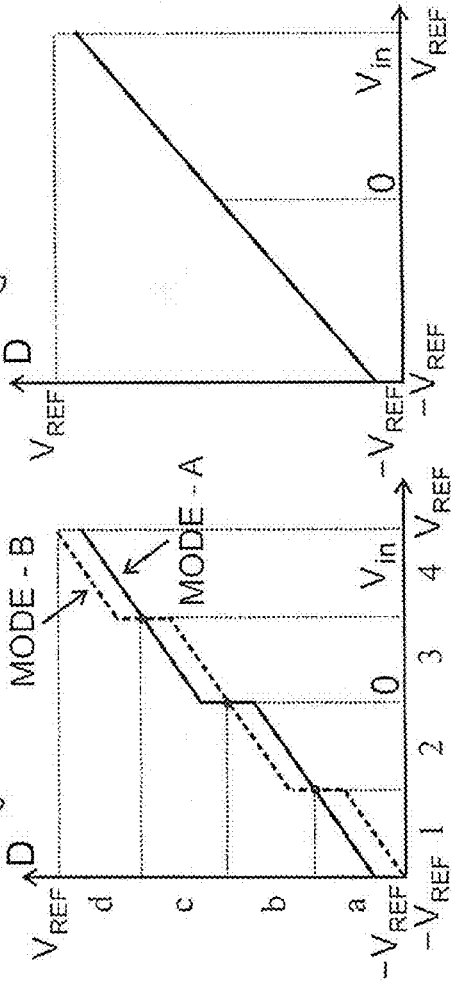
Fig. 7(a)
Fig. 7(b)
Fig. 7(c)
Fig. 7(d)

DUAL-MODE BASED DIGITAL BACKGROUND CALIBRATION OF PIPELINED ADCS FOR GAIN VARIATIONS AND DEVICE MISMATCHES

CROSS-REFERENCE TO RELATED APPLICATIONS

The present application is based upon, and claims the benefit of priority under 35 U.S.C. §119, to U.S. Provisional Patent Application No. 61/141,138 (the "'138 provisional application"), filed Dec. 29, 2008 and entitled "Digital Background Calibration of Pipelined ADCs Using Dual Modes And Zero-Cost Acceleration"; and to U.S. Provisional Patent Application No. 61/145,163 (the "'163 provisional application"), filed Jan. 16, 2009 and entitled "Digital Background Calibration of Pipelined ADCs Using Dual Modes And Zero-Cost Acceleration." The contents of the '138 provisional application and the '163 provisional application are incorporated herein by reference in their entireties as though fully set forth.

STATEMENT REGARDING FEDERALLY SPONSORED RESEARCH

This invention was made with government support under grant NSF/PHY-06-46094, Science of Nanoscale Systems and Their Device Applications, awarded by the National Science Foundation. The government has certain rights in the invention.

BACKGROUND

In pipelined analog-to-digital converters (ADCs), the major sources of error include gain insufficiency, gain nonlinearity and capacitor mismatches. When digital background calibration of pipelined ADCs is performed, typically the first step is to extract, in background, quantitative information about the error sources or the errors themselves. The second step is to use the extracted information to correct the errors.

While the second step in the digital background calibration of pipelined ADCs, namely correcting the errors using the information extracted in background, is generally simple and straightforward, a lot of research effort is spent on developing new, improved ways of executing the first step, namely extracting quantitative information about the error sources and/or errors.

BRIEF DESCRIPTION OF DRAWINGS

The drawing figures depict one or more implementations in accordance with the concepts disclosed herein, by way of example only, not by way of limitations. The drawings disclose illustrative embodiments. Other embodiments may be used in addition or instead.

FIGS. 1(b) and 1(c) illustrate the two operational modes during the charge transfer phases of the 1.5 bit-per-stage pipelined ADC that is configured to implement a background correlation described in the present disclosure.

FIG. 2 illustrates the residue curves of the two operational modes shown in FIGS. 1(b) and 1(c).

FIGS. 7(a) and 7(b) illustrate the residue curves for a first operation mode of a 1 bit-per-stage pipelined ADC, Mode-A, and a second operation mode of a 1 bit-per-stage pipelined ADC, Mode-B, in accordance with one embodiment of the present disclosure.

FIG. 7(c) illustrate the ADC transfer curves for Mode-A and Mode-B.

FIG. 7(d) illustrate the linear transfer curve after calibration.

DETAILED DESCRIPTION

Methods and systems are described relating to pipelined ADCs with a dual-mode based digital background calibration for gain variations and device mismatches.

In some embodiments of the present disclosure, errors caused by gain insufficiency, nonlinearity, and capacitor mismatches are corrected by operating one ADC in two circuit configurations. These two modes are so arranged that their digital outputs differ in the presence of gain nonlinearity, gain insufficiency, and capacitor mismatches. The output difference is measured by randomly choosing one of the two operation modes at each sampling clock and digitally correlating the resulting digital output sequence. The measured output difference, which represents ADC errors, is used to remove the errors.

Figure 1A:
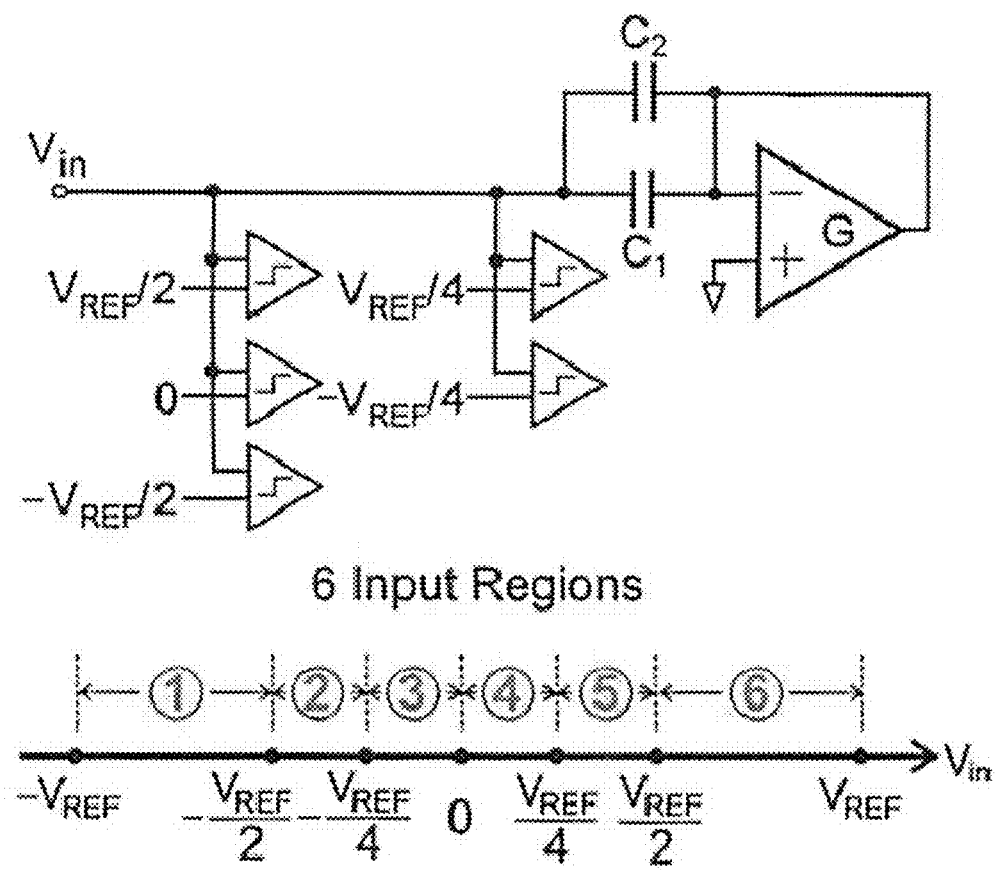
FIG. 1(a) illustrates the sampling phase of a 1.5 bit-per-stage pipelined ADC that is configured to implement a background correlation technique described in the present disclosure.

FIGS. 1(a)-1(c) illustrate circuit arrangements for the two ADC operation modes. In the illustrated example, nonidealities are assumed only in the $1^{st}$ stage. It is noted that while in the illustrated embodiment nonidealities are assumed in the $1^{st}$ stage only, for simplicity, the principles described in the present disclosure can be expanded to correct nonidealities in subsequent stages as well.

In particular, FIG. 1(a) illustrates the sampling phase of a 1.5 bit-per-stage pipelined ADC. Although a 1.5 bit-per-stage pipelined ADC is used in the illustrated embodiment, other embodiments may use different types of pipelined ADCs, including but not limited to multi bit-per-stage pipelined ADCs.

As seen in FIG. 1(a), the circuit configuration is standard, except for three extra comparators. The total of five comparators compare a sampled input, $V_{in}$, to 5 levels, namely 0, $\pm V_{REF}/4$, $\pm V_{REF}/2$, to locate it in one of the six input regions shown with circled numbers ①-⑥ in FIG. 1(a).

FIGS. 1(b) and 1(c) illustrate the two operational modes during the charge transfer phases of the 1.5 bit-per-stage pipelined ADC. It is in this subsequent charge transfer phase that two operation modes, referred to as Mode-A and Mode-B, are used. In Mode-A, illustrated in FIG. 1(b), capacitor $C_1$ is split into two sub-capacitors, $C_1/3$ and $2C_1/3$. $C_1/3$ is connected to ground; $2C_1/3$ is connected to one of the three reference voltages, 0, $\pm 3V_{REF}/2$, depending on which region the input lies. (This is determined in the sampling phase.) For example, if the input lies in region ⑤ or ⑥, $2C_1/3$ is connected to $+3V_{REF}/2$.

FIGS. 2(a) and 2(b) illustrate the residue curves of the two operational modes shown in FIGS. 1(b) and 1(c). These curves are the same as that of the standard 1.5-b stage. In Mode-B, $C_1$ is again split into two sub-capacitors, $C_1/3$ and $2C_1/3$, but these subcapacitors are connected to the three references in a different way. Their connections are so arranged that the residue curve, shown in FIG. 2(b), is the same as that of the standard 2-b stage (with 1-b redundancy).

Figure 3:
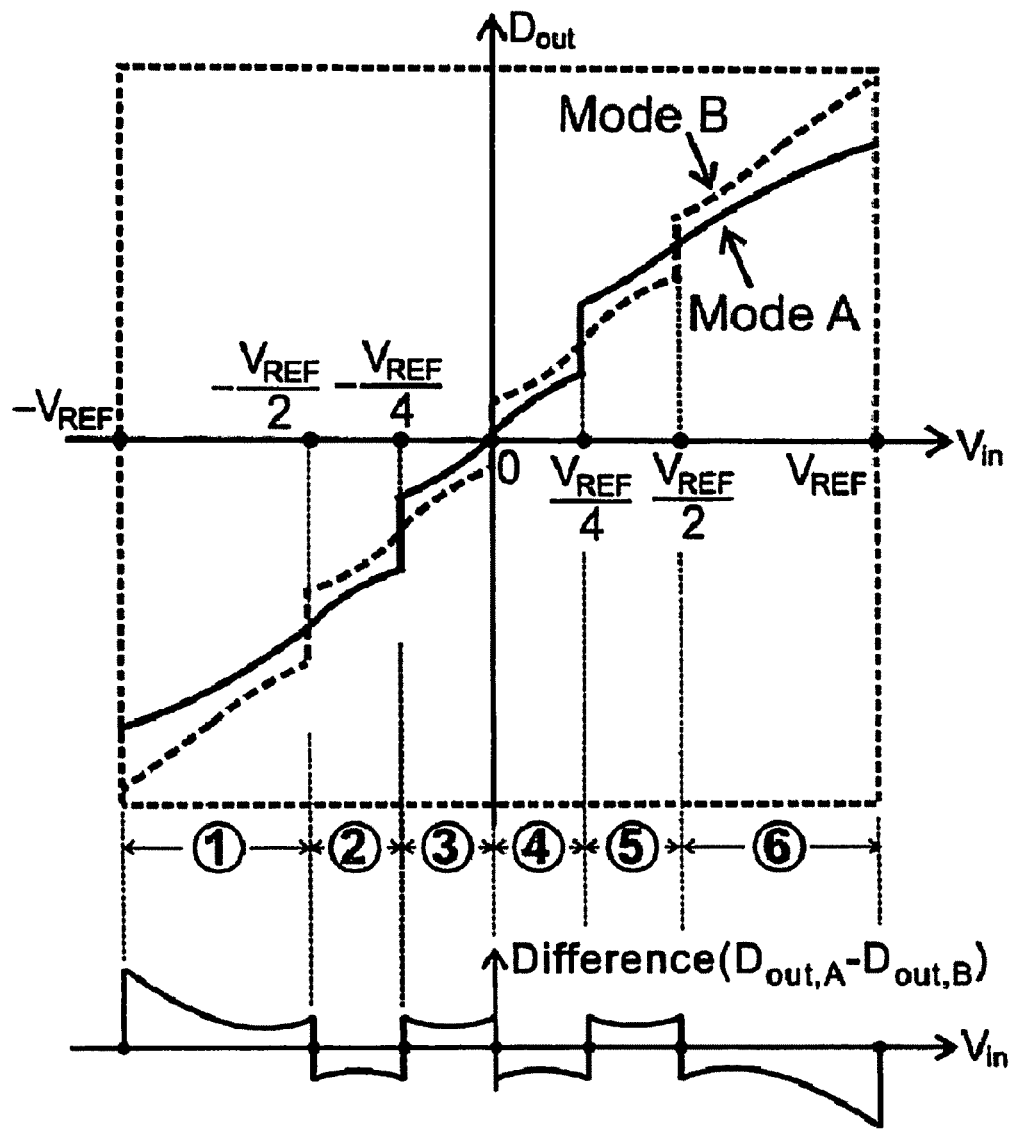
FIG. 3 illustrates the overall ADC input-output transfer curves for the two operational modes.

FIG. 3 illustrates the overall ADC input-output transfer curves for the two operational modes. The Mode-A transfer curve is similar to that of the 1.5-b stage, with two regions of missing codes at $\pm V_{REF}/4$. The Mode-B transfer curve is similar to that of the 2-b stage, with three regions of missing codes at 0 and $\pm V_{REF}/2$. The length of the gaps caused by the missing codes, which is the same across different gap positions and between the two modes, is a combined effect of the gain insufficiency & nonlinearity and capacitor mismatches. The curvature in each transfer curve is a manifestation of the gain nonlinearity. Thus, the gap length and curvature in either transfer curve represent ADC errors caused by the nonidealities. Thus once the gap length and curvature are extracted, the ADC errors can be estimated and corrected.

In one embodiment, the gap length and curvature are extracted by measuring the output difference between the two modes, which is shown at the bottom of FIG. 3. For a given input, the output difference is proportional to the gap length. Also, the averaged output differences in regions ① and ⑥ are larger than those in regions ②, ③, ④, and ⑥, because the same degree of residue gain nonlinearity causes larger errors at larger residue voltages. Thus, the disparity between the averaged output differences in regions ① and ⑥, and those in regions ② through ⑤ conveys information on the gain nonlinearity, or, the curvature. In this way, the gap length and curvature can be extracted from the six averaged output differences in the six input regions.

Figure 4:
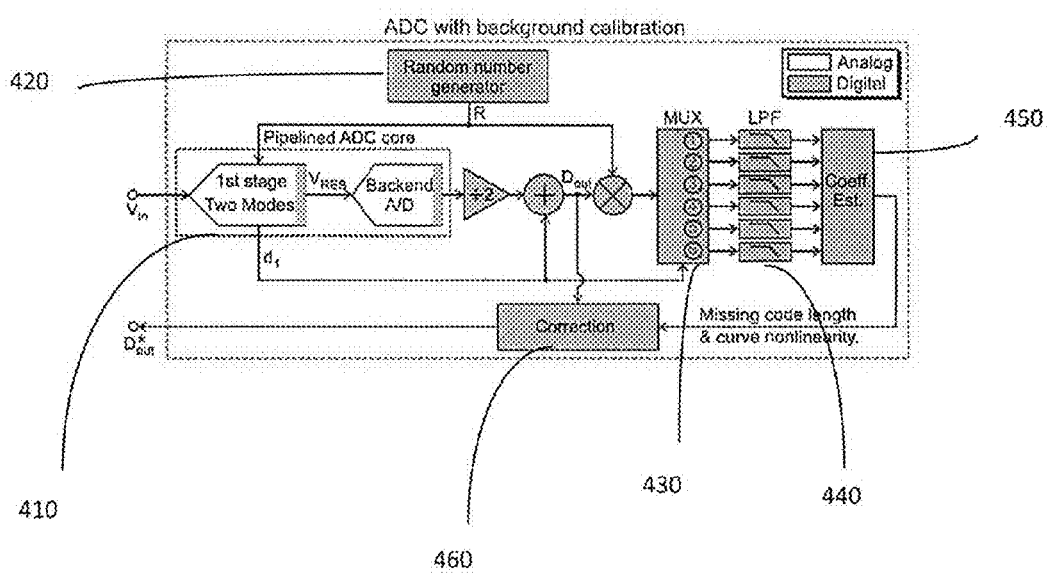
FIG. 4 illustrates a system for correlation-based digital background calibration of a pipelined ADC, in accordance with one embodiment of the present disclosure.

FIG. 4 illustrates a system 400 for correlation-based digital background calibration, in accordance with one embodiment of the present disclosure. In this embodiment, digital background correlation is performed using the architecture shown in FIG. 4.

In overview, the system 400 includes: a pipelined ADC core 410; a random number generator 420; a multiplexer (MUX) 430; a low pass filter (LPF) 440; a coefficient estimation block 450; and a correction block 460. A pseudo-random number R from the random number generator 420 selects one of the two modes to run, assuming $\pm 1$ with equal probability. Correlation of the ADC output ($D_{out}$) with R, followed by low pass filtering by the LPF 440, produces the averaged output difference. The multiplexer 430 is controlled by the 1st-stage comparator decision, $d_1$, to obtain the averaged difference in each of the six input regions. The six averaged differences are used in the coefficient estimation block 450 to compute the gap length and curvature, which are used in the correction block 460 to produce an error-free output, $D^*_{out}$.

The calibration method described above cannot correct the curvature error if the input amplitude does not reach region ① and ⑥, for the estimation of the curvature relies on the knowledge of the disparity between the averaged output differences in regions ① and ⑥ and those in regions ② to ⑤. However, when the input amplitude is small, the conversion error due to the curvature becomes less significant because the limited input suffers much less from gain nonlinearity. Nonetheless, in high accuracy (>12-b ENOB) applications, the curvature can be readily extracted by modifying the algorithm and comparing, in any region among ② to ⑤, the output difference around the region center with that near the region sides.

A mathematical description of how the gap length and curvature of the ADC transfer curves can be extracted from the averaged output differences between the two modes is now provided. Without loss of generality, $V_{REF}$ is set to 1 V. As described above, nonidealities are assumed only in the 1st stage. The variable X is used to represent any reference voltage to which $C_1/3$ of FIG. 1 is connected, and variable Y to represent any reference voltage to which $2C_1/3$ of FIG. 1 is connected.

Figure 5:
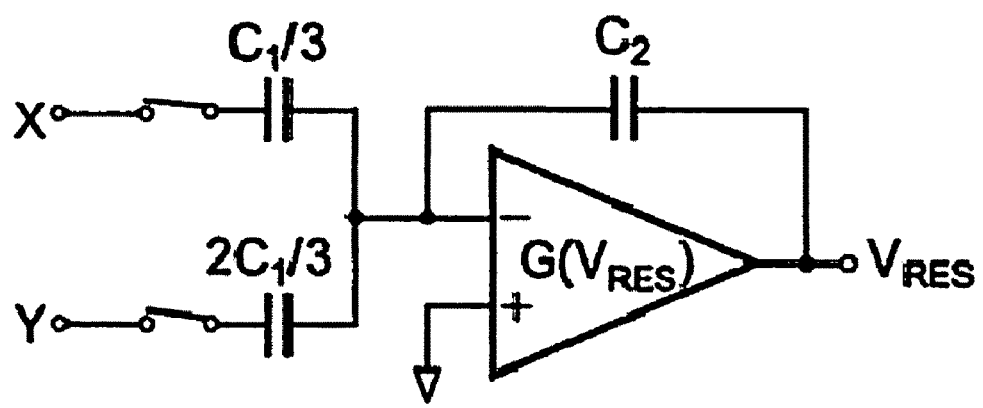
FIG. 5 illustrates a unified circuit model for the two charge transfer modes shown in FIGS. 1(b) and 1(c).

FIG. 5 illustrates a unified circuit model for the two charge transfer modes. Specific X and Y values depend on the operation modes and input region. Using X and Y, the charge transfer phase of Mode-A [shown in FIG. 1(b)] and that of Mode-B [shown in FIG. 1(c)] can be represented together by the circuit of FIG. 5.

Charge conservation in FIG. 5 establishes the relation between residue voltage, $V_{RES}$, and input voltage, $V_{in}$:

$$V_{RES}[1+\Delta+2/G(V_{RES})]=(2+\Delta)V_{in}-1/3\,X-2/3=T$$

In the above equation, $\Delta=C_2/C_1-1$ represents $C_1$-$C_2$ mismatch, and $G(V_{RES})$ is the nonlinear large-signal open-loop gain of the op amp.

For a differential op amp, $G(V_{RES})$ may be approximated, to the $2^{nd}$ order, as $G(V_{RES})=G_1-G_3 V_{RES}^2$.

Substituting the $2^{nd}$-order $G(V_{RES})$ in the above equation yields an expression for $V_{RES}$ that is approximately equal to: $T(1-\Delta-2/G_1)-(2G_3/G_1^2)T^3$ The corresponding input-output ADC transfer function is:

$$D_{out}=(1/2)[(2+\Delta)V_{in}-(\Delta+2/G_1)T-(2G_3/G_1^2)T^3].$$

The $2^{nd}$ and $3^{rd}$ terms on the right hand side collectively create the gaps in the transfer curves, while the $3^{rd}$ term is responsible for their curvature. Therefore, if the values for $\Delta+2/G_1$ and $G_3/G_1^2$ appearing in the $2^{nd}$ and $3^{rd}$ terms can be extracted, the gap and curvature errors can be removed from $D_{out}$ to yield error-free output, $D^*_{out}$.

$$D^*_{out}=D_{out}-(\Delta+2/G_1)(1/3X+2/3Y)/2+G_3/G_1^2(2D_{out}-1/3X-2/3Y)^3$$

Keeping $\Delta$, $1/G_1$, and $G_3/G_1^2$ to the $1^{st}$ order, the error-free output $D^*_{out}$ is approximately equal to: $(1-\Delta/2-2/G_1)V_{in}$.

After the error removal, the transfer curve is a straight line, where the slope error corresponds to overall gain error, not linearity error.

The values of $\Delta+2/G$ and $G_3/G_1^2$ can be extracted from the output difference between Mode-A and Mode-B. From the above equation for $D_{out}$, it is seen that the output difference is $$D_{out,A}-D_{out,B}=(\Delta+2/G_1)(T_B-T_A)/2-G_3/G_1^2(T_B^3-T_A^3).$$

where subscripts A and B refer to Mode-A and Mode-B operations.

Using the relation between the residue voltage and the input voltage, $T_B-T_A=(X_A-X_B)/3+2(Y_A-Y_B)/3$, which assumes input-region-dependent values. By substituting these $T_B-T_A$ values, and taking average of $T_B^3-T_A^3$ over each of the six input regions, the average over

| $D_{out,A} - D_{out,B}$ is obtained as: | |
|---|---|
| $+(\Delta + 2/G_1)/4 + G_3/4G_1^2$ | in region ① |
| $-(\Delta + 2/G_1)/4 - G_3/16G_1^2$ | in region ② |
| $+(\Delta + 2/G_1)/4 + G_3/16G_1^2$ | in region ③ |
| $-(\Delta + 2/G_1)/4 - G_3/16G_1^2$ | in region ④ |

-continued

| $D_{out,A} - D_{out,B}$ is obtained as: | |
|---|---|
| $+(\Delta + 2/G_1)/4 + G_3/16G_1^2$ | in region ⑤ |
| $-(\Delta + 2/G_1)/4 - G_3/4G_1^2$ | in region ⑥ |

Only two among the six equations are independent, and by solving any two equations, we obtain $\Delta+2/G_1$ and $G_3/G_1^2$. The four excess equations can be used in reducing coefficient estimation noise in the correlation loop.

In the following sections, alternative embodiments of dual-mode digital background calibration methods and systems are described in which perfect gain linearity is assumed, i.e. it is assumed that the finite (insufficient) amplifier gain is independent of the input amplitude. These methods and systems (described in conjunction with FIGS. 6(a) to 9) pertain to cases when gain nonlinearity is weak enough for its effect to fall below the thermal and quantization noise.

Figure 6A:
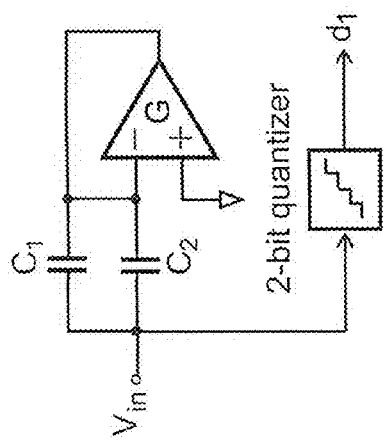
FIGS. 6(a), 6(b) and 6(c) illustrate the MSB (Most Significant Bit) stage of a 1 bit-per-stage pipelined ADC that is configured to implement a background correlation technique described in the present disclosure.

FIG. 6(a) illustrates the MSB (Most Significant Bit) stage of a 1 bit-per-stage pipelined ADC. In the illustrated embodiment, capacitor mismatches and insufficient amplifier gains are assumed only in the MSB stage. The remaining stages are assumed ideal. It is noted that while in the illustrated embodiment nonidealities are assumed in the 1$^{st}$ stage only, for simplicity, the principles described in the present disclosure can be applied to correct nonidealities in subsequent stages as well.

In the embodiment illustrated in FIG. 6(a), the operational amplifier has a finite gain G. The two capacitors $C_1$ and $C_2$ are not perfectly matched. In the illustrated embodiment, the degree of the mismatch may be quantified using $\Delta \equiv C_2/C_1 - 1$.

In the sampling phase shown in FIG. 6(a), the ADC's analog input voltage $V_{in}$ sampled and held on capacitors $C_1$ and $C_2$ is processed through a 2-bit quantizer, yielding the MSB output, $d_1$, in the 2-bit form. The 2-bit quantizer is used instead of the conventional 1-bit quantizer, because $d_1$ in the 2-bit form facilitates setting up two proper operation modes. In one embodiment, this is done in the charge transfer phase, as further explained in conjunction with FIGS. 6(b) and 6(c), below. The difference between the two modes arises from the different sets of reference voltages used.

Figure 6B:
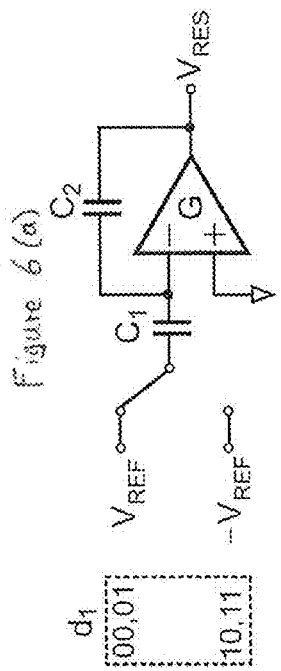
Figure 6C:
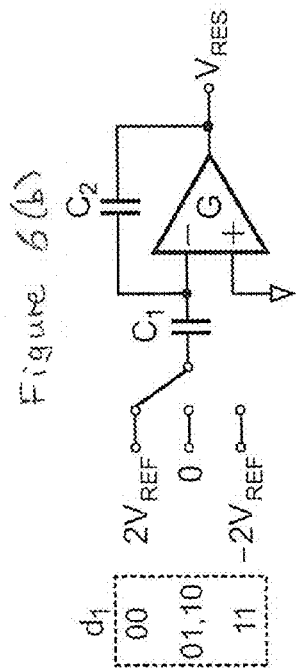

FIGS. 6(b) and 6(c) illustrate two different configurations in the charge transfer phase. In particular, FIG. 6(b) illustrates a first operation mode, again referred to as Mode-A, while FIG. 6(c) illustrates a second operation mode, again referred to as Mode-B.

The operation mode shown in FIG. 6(b), namely Mode-A, is just the standard charge transfer phase. In this mode, the residue voltage $V_{RES}$ is related to $V_{in}$ as follows:

$$V_{RES,A} = \begin{cases} (2-\alpha)V_{in} + (1-\beta)V_{REF} & [d_1 = 00, 01] \\ (2-\alpha)V_{in} - (1-\beta)V_{REF} & [d_1 = 10, 11] \end{cases} \quad (1)$$

In the equation above, the subscript A denotes Mode-A operation, and $\alpha$ and $\beta$ are given by:

$$\alpha \equiv \Delta + (4 + 2\Delta)/G \quad (2)$$

$$\beta \equiv \Delta + (2 + \Delta)/G \quad (3)$$

In equation (1) above, the input capacitance of the amplifier has been ignored. While its effect can be included by redefining $\alpha$ and $\beta$, the input capacitance does not affect the calibration approach that is being presented, i.e. all equations following equation (1) remain intact.

FIGS. 7(a) and 7(b) illustrate the residue curves for Mode-A and Mode-B. In particular, FIG. 7(a) depicts $V_{RES,A}$ versus $V_{in}$, per equation (1) above. As seen in FIG. 7(a), the slope (the closed loop gain) is less than the ideal value of 2, and the residue does not span the ideal full range. Such an error in residue voltage is caused by the capacitor mismatch, $\Delta$, and insufficient amplifier gain, G, of the MSB stage.

The analog input, $V_{in}$, of the ADC can be related to its digital output, $D_A$, when the MSB stage is in Mode-A. The digital output $D_A$ is a combination of $d_1$ and the digital representation of $V_{RES,A}$, which is denoted in the present disclosure as $D(V_{RES,A})$. The relation between $D_A$, $D(V_{RES,A})$ and $d_1$ is given by the following equation:

$$D_A = \begin{cases} [D(V_{RES,A}) - V_{REF}]/2 & [d_1 = 00, 01] \\ [D(V_{RES,A}) + V_{REF}]/2 & [d_1 = 10, 11] \end{cases} \quad (4)$$

In equation (4) above, $D(V_{RES,A})$ is the digital output of the partial pipelined ADC consisting of the 2$^{nd}$ through the last stage, whose analog input is $V_{RES,A}$. Since these stages are all ideal, it can be written that $D(V_{RES,A})=V_{RES,A}$. Using this relation and equation (1) in (4), the following relation is obtained between $D_A$ and $V_{in}$:

$$D_A = \begin{cases} (1-\alpha/2)V_{in} - \beta V_{REF}/2 & [d_1 = 00, 01] \\ (1-\alpha/2)V_{in} + \beta V_{REF}/2 & [d_1 = 10, 11] \end{cases} \quad (5)$$

The operation mode shown in FIG. 6(c), namely Mode-B, differs from Mode-A because of a use of a nonconventional set of reference voltages. From the mapping between reference voltages and $d_1$ values shown in FIG. 6(c), the need for $d_1$ in the 2-bit form can be seen.

The residue voltage $V_{RES,B}$ in this mode is related to $V_{in}$, via equation (6) below:

$$V_{RES,B} = \begin{cases} (2-\alpha)V_{in} + 2(1-\beta)V_{REF} & [d_1 = 00] \\ (2-\alpha)V_{in} & [d_1 = 01, 10] \\ (2-\alpha)V_{in} - 2(1-\beta)V_{REF} & [d_1 = 11] \end{cases} \quad (6)$$

The corresponding, erroneous residue curve is depicted in FIG. 7(b).

Subsequently, the ADC's analog input $V_{in}$ can be related to the ADC's digital output, $D_B$, when the MSB stage is in Mode-B, following exactly the same procedure used in the Mode-A case:

$$D_B = \begin{cases} [D(V_{RES,B}) - V_{REF}]/2 & [d_1 = 00] \\ D(V_{RES,B})/2 & [d_1 = 01, 10] \\ [D(V_{RES,B}) + V_{REF}]/2 & [d_1 = 11] \end{cases} \quad (7)$$

$$= \begin{cases} (1-\alpha/2)V_{in} - \beta V_{REF} & [d_1 = 00] \\ (1-\alpha/2)V_{in} & [d_1 = 01, 10] \\ (1-\alpha/2)V_{in} + \beta V_{REF} & [d_1 = 11] \end{cases}$$

Equations (5) and (7) represent the ADC's input-output transfer characteristics corresponding to the two different modes, Mode-A and Mode-B. If the amplifier gain is sufficient (G→∞) and capacitors are well matched ($\Delta$=0), $\alpha$=$\beta$=0, and the two input-output transfer characteristics would become the same, error-free, expression $D=V_{in}$.

In contrast, with a finite value of G and/or a non-zero capacitor mismatch ($\Delta \neq 0$), neither $\alpha$ nor $\beta$ is zero, and consequently, the two ADC transfer functions (5) and (7) differ from each other. Thus, the two modes yield different digital outputs for the same analog input. This can be visualized by plotting together both transfer curves, as shown in FIG. 7(c).

FIG. 7(c) illustrate the ADC transfer curves for Mode-A and Mode-B. Each transfer curve is separated linear lines with missing codes in between, where the missing codes are consequences of the component non-idealities. Since there is one missing code at $V_{in}=0$ for Mode-A while there are two missing codes at $V_{in}=\pm V_{REF}/2$ for Mode-B, the two transfer curves differ from each other. Note that the three missing codes have the same length of $\beta V_{REF}$.

The two operation modes should be such that the difference between their digital outputs for the same analog input should carry information on the missing code length $\beta V_{REF}$. This is because extraction of the missing code length information is sought from the digital output difference between the two modes, as explained above. It can be seen that the two modes have indeed been set up properly, since their digital output difference is given by:

$$D_A - D_B = \begin{cases} +\beta V_{REF}/2 & [\text{Region ①}] \\ -\beta V_{REF}/2 & [\text{Region ②}] \\ +\beta V_{REF}/2 & [\text{Region ③}] \\ -\beta V_{REF}/2 & [\text{Region ④}] \end{cases} \quad (8)$$

and the absolute value of the digital output difference, namely $$|D_A - D_B| = \frac{\beta V_{REF}}{2}, \quad (9)$$

is given by half the missing code length $\beta V_{REF}$. Thus by measuring the digital output difference, the missing code length can be readily obtained.

In the equation-above, the circled numbers represent all possible regions of values the ADC input $V_{in}$ can assume, as also seen in FIG. 7(c).

The missing code length, which is proportional to $\beta=\Delta+(2+\Delta)/G$ (as given in Eq. (3)), is the collective effect of the capacitor mismatch $\Delta$ and the finite amplifier gain G.

FIG. 7(d) illustrate the linear transfer curve after calibration. As long as the missing code length is obtained from the digital output difference, without knowing $\Delta$ or G separately, the missing codes can be removed from either one of the two transfer curves of FIG. 7(c), and the same error-free straight line shown in FIG. 7(d) can be formed.

In this way, errors caused by capacitor mismatches and finite gains can be calibrated out altogether.

The linear line of FIG. 7(d), obtained as a result of the calibration, can be represented by the following equation:

$$D^*_A = D^*_B = (1-\alpha/2)V_{in}, \quad (10)$$

where $D^*_A$ and $D^*_B$ signify calibrated digital outputs for Mode-A and Mode-B. Although the slope of the line, (1−α/2), is less than the ideal value of 1, in most applications this slope error does not matter.

Figure 8:
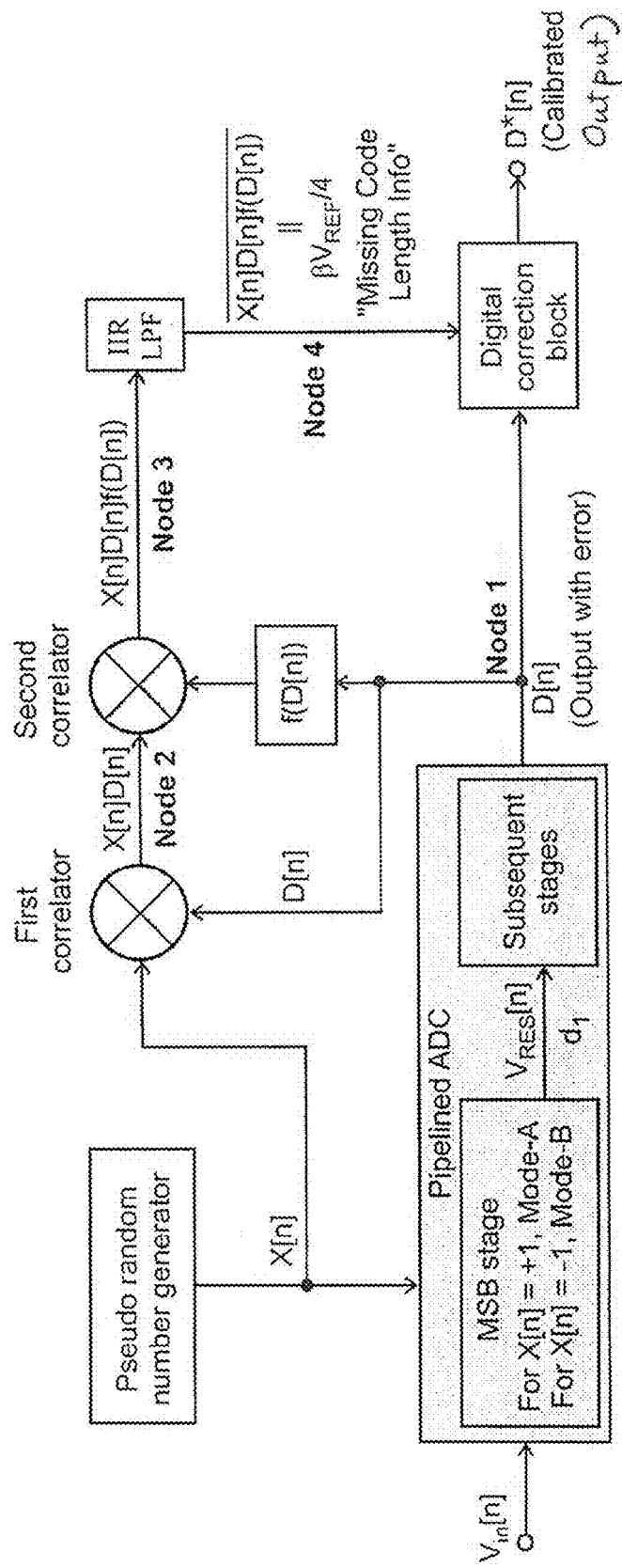
FIG. 8 illustrates a correlation-based digital background calibration architecture for the 1 bit-per-stage pipelined ADC shown in FIGS. 6(a)-6(c).

FIG. 8 illustrates a correlation-based digital background calibration architecture for the embodiments described in FIGS. 6(a)-7(d).

When an ADC is in action, $D_A$ and $D_B$ cannot be obtained simultaneously, for a given input $V_{in}$. Hence, when performing digital background calibration, extraction of the missing code length $\beta V_{REF}$ directly using equation (9) above is not feasible. Instead, a time-averaged version of (9) can be obtained to extract the missing code length, in one embodiment of the present disclosure, by randomly switching ADC operation between Mode-A and Mode-B, and by properly correlating the resulting data sequence.

In foreground calibration, $D_A$ may be first obtained through Mode-A operation, then $D_B$ may be obtained through Mode-B operation, both for the same input. Equation (9) can then be used to obtain the missing code length. The present disclosure relates, however, to background (not foreground) calibration.

In one embodiment of the present disclosure, digital background correlation is performed using the architecture shown in FIG. 8. In the embodiment illustrated in FIG. 6, component non-idealities are assumed only in the MSB stage, and thus, Mode-A and Mode-B operations are set up only in the MSB stage.

In the illustrated embodiment, switching between the two modes may be commanded by pseudo-random variable X[n], which assumes +1 and −1 with equal probability. When X[n]=1, Mode-A is chosen, and the ADC output of equation (5) appears as D[n] at Node 1. When X[n]=−1, Mode-B is chosen, yielding ADC output of (7) as D[n] at Node 1.

The correlation of X[n] with D[n] in FIG. 8 results in X[n]D[n] at Node 2. Since X[n]=1 for Mode-A, and X[n]=−1 for Mode-B, it can be intuitively guessed that the time average of X[n]D[n] should be equal to the time average of $(D_A[n]-D_B[n])/2$. The factor ½ is needed here, because X[n]D[n] for a given n is $D_A[n]$ or $-D_B[n]$ but not both, while $D_A[n]-D_B[n]$ includes both $D_A[n]$ and $-D_B[n]$ for a given n.

Although $(D_A[n]-D_B[n])/2$ carries information on the missing code length $\beta V_{REF}$, as seen in (8), the same equation indicates that $(D_A[n]-D_B[n])/2$ assumes both positive and negative values of the same magnitude with equal probability as $V_{in}[n]$ over time assumes values all across regions ① through ④, shown in FIG. 7(c). As explained in conjunction with FIG. 2(c), regions ① through ④ represent all possible regions of values that D[n] can take. Therefore, time averaging of $(D_A[n]-D_B[n])/2$, or time averaging of X[n]D[n], must yield zero, erasing the missing code length information.

To circumvent this problem, the time average of X[n]D[n] f(D[n]) may be taken instead of the time average of X[n]D[n], where f(D[n]) is defined as:

$$f(D[n]) = \begin{cases} +1 & [\text{for } D[n] \text{ in Region ⓐ}] \\ -1 & [\text{for } D[n] \text{ in Region ⓑ}] \\ +1 & [\text{for } D[n] \text{ in Region ⓒ}] \\ -1 & [\text{for } D[n] \text{ in Region ⓓ}] \end{cases} \quad (11)$$

By comparing f(D[n]) with equation (8), it can be seen that: $(D_A[n]-D_B[n])/2 \cdot f(D[n]) = |D_A[n]-D_B[n]|/2$. It is noted that if $D_A[n]$ is in Region ⓚ (where k is any of a, b, c, and d), $D_B[n]$ is in the same region. Thus, $f(D_A[n])=f(D_B[n])$.

Therefore, the time average of X[n]D[n]f(D[n]) is expected to be the same as the time average of $|D_A[n]-D_B[n]|/2$, which is not zero any more due to the absolute value taken before the averaging, but is $\beta V_{REF}/4$ according to (9).

In FIG. 8, X[n]D[n]f(D[n]) appears at Node 3 after the second correlator, and its time average is done using the discrete-time low pass filter (LPF). The output of the LPF at Node 4 is then given by $$[LPF\ output] = \overline{X[n]D[n]f(D[n])} = \beta V_{REF}/4 \quad (12)$$

where the overline denotes the time averaging. From the LPF output, the missing code length can be extracted:

$$\beta V_{REF} = \overline{4X[n]D[n]f(D[n])} \quad (13)$$

Equation (12) has been obtained based on a guess that X[n]D[n] would be equal to $(D_A[n]-D_B[n])/2$, and a subsequent guess that X[n]D[n]f(D[n]) would then be the same as $|D_A[n]-D_B[n]|/2$. In a quantitative treatment set forth below, Equation (12) may be confirmed by carrying out an explicit time averaging calculation for X[n]D[n]f(D[n]) without resorting to any guesses.

First, the five expressions in (5) and (7) can be lumped together into a single expression, given below:

$$D[n] = \left(1-\frac{a}{2}\right)V_{in} + \frac{\beta V_{REF}}{2}T[n]\left(1+S[n]\frac{1-X[n]}{2}\right). \quad (14)$$

To obtain equation (14) above, the fact that X[n]=1 for Mode-A and X[n]=−1 for Mode-B was used. In equation (14) above, S[n] and T[n] are defined as:

$$S[n] \equiv \begin{cases} +1 & [\text{for } D[n] \text{ in Region } \text{ⓐ}, \text{ⓓ}] \\ -1 & [\text{for } D[n] \text{ in Region } \text{ⓑ}, \text{ⓒ}] \end{cases} \quad (15)$$

$$T[n] \equiv \begin{cases} -1 & [\text{for } D[n] \text{ in Region } \text{ⓐ}, \text{ⓑ}] \\ +1 & [\text{for } D[n] \text{ in Region } \text{ⓒ}, \text{ⓓ}] \end{cases}. \quad (16)$$

The LPF's input, X[n]D[n]f(D[n]), at Node 3 of FIG. 3, is then expressed as:

$$X[n]D[n]f(D[n]) = \left(1-\frac{a}{2}\right)V_{in}[n]f(D[n])X[n] \quad (17)$$
$$+\frac{\beta V_{REF}}{2}T[n]f(D[n])X[n]$$
$$+\frac{\beta V_{REF}}{4}T[n]S[n]f(D[n])X[n]$$
$$-\frac{\beta V_{REF}}{4}T[n]S[n]f(D[n]).$$

Since X[n]D[n]f(D[n]) goes through the LPF, it must be considered how each term of (17) is time averaged. $V_{in}[n]f(D[n])$ in the first term assumes negative and positive values with equal probability, as $V_{in}[n]$ takes values across the entire range of its possible values over time. Similarly, the time average of the second term is zero. Both the third and fourth terms of equation (17) contain the common factor T[n]S[n]f(D[n]), which assumes the same negative value of −1 throughout all regions of the ADC input $V_{in}[n]$. Therefore, the time average of the fourth term will be $\beta V_{REF}/4$, but the third term will vanish since X[n] assumes +1 and −1 with equal probability.

In summary, the time average of equation (17) becomes $$\overline{X[n]D[n]f(D[n])} = \beta V_{REF}/4 \quad (18)$$

Equation (18) agrees with equation (12).

Once the missing code length $\beta V_{REF}$ is obtained as described above, the erroneous ADC output D[n] at Node 1 of FIG. 8 or in equation (14) can be corrected using a digital block in FIG. 8, whose basic operation is:

$$D^*[n] = D[n] - \frac{\beta V_{REF}}{2}T[n]\left(1+S[n]\frac{1-X[n]}{2}\right) \quad (19)$$
$$= (1-a/2)V_{in}[n]$$

Since the missing code length $\beta V_{REF}$ has been measured, the quantity subtracted from D[n] in the first line of the equation is known. The second line corresponds to the calibrated digital output. This calibrated output, which is equivalent to equation (10), corresponds to the linear transfer characteristic of FIG. 7(d). The errors caused by capacitor mismatch and insufficient gain have thus been calibrated out all together. Although the slope (1−α/2) of the calibrated linear transfer characteristic is less than the ideal value of 1, the slope error is not important in most applications.

So far, non-idealities have been assumed in the MSB stage only. The calibration method described above can be readily applied, however, to the practical case where every stage exhibits non-idealities. This can be seen in conjunction with a pipelined ADC with a total of N stages, where component non-idealities are now extended up to the second stage, while the rest stages are still assumed ideal.

Figure 9:
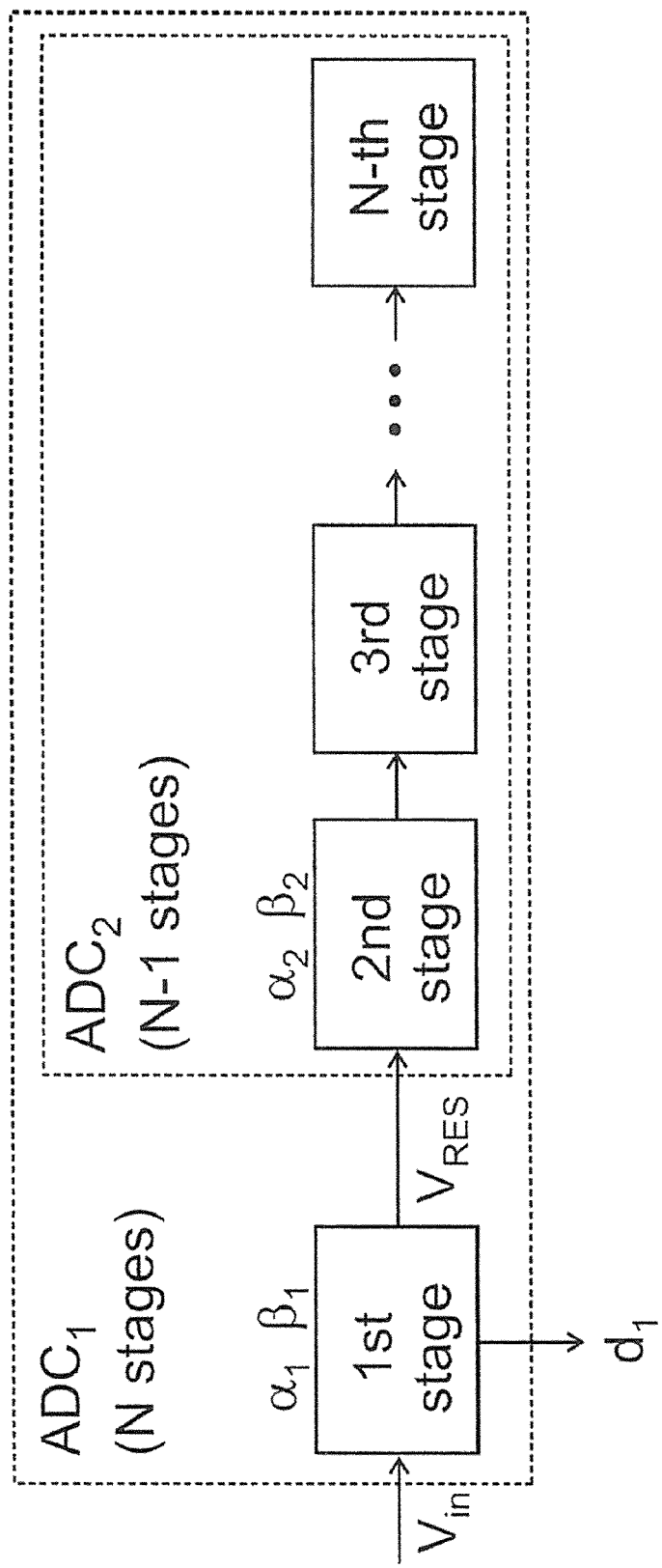
FIG. 9 illustrates an N-stage pipelined ADC with capacitor mismatches and finite amplifier gains in the first two stages.

FIG. 9 illustrates an N-stage pipelined ADC with capacitor mismatches and finite amplifier gains in the first two stages. In FIG. 9, the first two stages are shaded to emphasize their non-idealities. The first stage has non-zero error parameters $\alpha_1$ and $\beta_1$, which originate from capacitor mismatch $\Delta_1$ and finite gain $G_1$ in the first stage, set forth in Equations (2) and (3). Similarly, $\Delta_2$ and $G_2$ of the second stage yield non-zero error parameters of the second stage, $\alpha_2$ and $\beta_2$.

In FIG. 9, the $2^{nd}$ through the final stage may be thought of as an (N−1)-stage pipelined ADC, henceforth referred to as $ADC_2$. In this connection, the entire N-stage pipelined ADC will be called $ADC_1$. The analog input to $ADC_2$ is the residue voltage $V_{RES}$ of the first stage of $ADC_1$.

First, $ADC_2$ is calibrated. Since within $ADC_2$ only its first stage has component nonidealities, $ADC_2$ can be calibrated using the procedure described in the previous subsections, operating $ADC_2$'s first stage in dual modes. Depending on which mode $ADC_2$'s first stage is operated in, the digital output of $ADC_2$, $D(V_{RES})$ will come out in two different ways. Both of these two transfer characteristics of $ADC_2$ have missing codes with the same length of $\beta_2 V_{REF}$. This length can be extracted by measuring the digital output difference between the two modes, and can be subsequently used to remove the missing codes in either transfer curve. The calibrated digital output of $ADC_2$ from either transfer characteristic is given by $$D^*(V_{RES}) = (1-\alpha_2/2)V_{RES}. \quad (20)$$

After the calibration of $ADC_2$, $ADC_1$ is calibrated now operating $ADC_1$'s first stage in dual modes. The basic calibration procedure is again essentially the same as in the previous subsections. The digital output of $ADC_1$ for its analog input $V_{in}$ is a combination of $d_1$ and $D(V_{RES})$, the digital representation of $V_{RES}$. Therefore, when the first stage of $ADC_1$ is operated in Mode-A, the digital output of $ADC_1$ is given by $$D_A = \begin{cases} [D(V_{RES,A}) - V_{REF}]/2 & [d_1 = 00, 01] \\ [D(V_{RES,A}) + V_{REF}]/2 & [d_1 = 10, 11] \end{cases}. \quad (21)$$

$D(V_{RES,A})$ is now specified. In the previous subsections where only the first stage had component non-idealities, $D(V_{RES,A})$ was equal to $V_{RES,A}$. In the current case, $D(V_{RES,A})$ cannot be $V_{RES,A}$ due to errors incurred in the second stage. For $D(V_{RES,A})$, it is already calibrated version given by (20) is used instead, i.e. $D(V_{RES,A})=D^*(V_{RES,A})=(1-\alpha_2/2)V_{RES,A}$. Using this relation and equation (1), equation (21) can be rewritten as:

$$D_A = \begin{cases} (1 - \gamma/2)V_{in} - \delta V_{REF}/2 & [d_1 = 00, 01] \\ (1 - \gamma/2)V_{in} + \delta V_{REF}/2 & [d_1 = 10, 11] \end{cases}, \quad (22)$$

where $\gamma/2=1-(1-\alpha_2/2)(1-\alpha_1/2)$ and $\delta=1-(1-\alpha_2/2)(1-\beta_1)$.
Similarly, the digital output of $ADC_1$ when its first stage is in Mode-B is given by $$D_B = \begin{cases} (1 - \gamma/2)V_{in} - \delta V_{REF} & [d_1 = 00] \\ (1 - \gamma/2)V_{in} & [d_1 = 01, 10] \\ (1 - \gamma/2)V_{in} + \delta V_{REF} & [d_1 = 11] \end{cases}. \quad (23)$$

The two transfer curves (22) and (23) differ from each other, because they have missing codes in different locations. All the missing codes from either transfer characteristic have the same length of $\delta V_{REF}$. The absolute value of the digital output difference between the two modes is given by $$|D_A - D_B| = \delta V_{REF}/2, \quad (24)$$

which is half the missing code length.

Therefore, the missing code length information can be extracted from the digital output difference between the two modes. Subsequently, by using this information, the missing codes can be removed from either of the two transfer curves, to obtain the calibrated digital output of $ADC_1$:

$$D^*_A = D^*_B = (1-\gamma/2)V_{in}. \quad (25)$$

In summary, $ADC_2$ is first calibrated, and then $ADC_1$, in a recursive manner. The procedure in each of these calibrations is essentially the same as the calibration procedure of the previous subsections, where only the first stage had component nonidealities, although the missing code length and slope error are modified. Now by induction, the recursive algorithm can be extended to the case where all stages have component non-idealities. Such a recursive algorithm was established in the art, for foreground calibration. In the present disclosure, the recursive algorithm is used in background, in conjunction with dual-mode operation and digital data correlation.

One advantage of the calibration scheme described above, in which random switching is performed between two operation modes in conjunction with data correlation extracts error information, is that it does not impose any constraint on ADC's input $V_{in}$.

In the methods and systems described above, since the dithering signal is not added to $V_{in}$ but is used for mode switching, $V_{in}$ can span the entire dynamic range and hence SNDR is not compromised. Furthermore, since the dithering signal can be maximized without affecting $V_{in}$, correlation-based calibration is inherently faster (when compared before any acceleration techniques are employed) in extracting error information, compared to the correlation-based schemes where dithering signals are added to $V_{in}$.

In fact, not only does the above calibration scheme impose no constraint on the amplitude of $V_{in}$, but it actually requires no condition on all other aspects of $V_{in}$. In this sense, the calibration scheme described above is advantageous not only over the correlation-based background calibration works that limit the amplitude of $V_{in}$, but also over several non-correlation-based background calibration techniques that still require certain characteristics for $V_{in}$, for example limited bandwidths. In light of this, the methods and systems described above can be especially useful in general purpose ADCs where the input signal characteristics are unknown a priori.

The extraction of the missing code lengths using the background data correlation takes a certain number of input samples, or a certain amount of time. This time is equivalent to the entire calibration time, since once the missing code lengths are extracted, the missing codes can be immediately removed using the operation defined by equation (19).

In one embodiment of the present disclosure, a zero-cost acceleration method is used that substantially reduces the time required for the missing code length extraction. This acceleration method is presented using the above-described dual-mode-based correlation architecture for extracting missing code lengths. This method is more general, however, and can be applied to any correlation-based background calibration to extract various forms of error information, including but not limited to missing code length, capacitor mismatch, and amplifier gain.

In the dual-mode-based correlation architecture, shown in FIG. 8 and discussed above, the missing code length is extracted by time averaging the term $X[n]D[n]f(D[n])$ in equation (17), using the discrete-time LPF. Denoting $X[n]D[n]f(D[n])$ as $I[n]$ for brevity, $I[n]$ consists of four terms, as seen in (17). Only the last term survives the time averaging to provide information on the missing code length, while the first three terms vanish after the time averaging. Therefore, the last term of equation (17) may be thought of as an input signal for the LPF, and the first three terms as input noise for the LPF. In the frequency domain, the signal is located at DC, while the noise terms exhibit white noise spectra. If the noise level is higher, a smaller LPF bandwidth should be used to obtain a certain target output SNR. A smaller LPF corresponds to a longer extraction time. For smaller noise, a larger LPF bandwidth can be used, leading to a shorter extraction time. In the acceleration technique described below, a method is devised of reducing the noise level at the input of the LPF, at zero cost.

Among the three noise terms of $I[n]$ seen in equation (17), the second and third terms may be ignored, as $\alpha \ll 1$ and $\beta \ll 1$. The first, dominant noise term can be approximated as:

$$[\text{Noise of } I[n], \text{Eq. } (17)] \approx V_{in}[n]X[n]f(D[n]). \quad (31)$$

If a good estimate of $V_{in}[n]$ can be obtained (denoted as $V^*_{in}[n]$), a large portion of the noise term above can be canceled, by subtracting $V^*_{in}[n]X[n]f(D[n]-)$ from the noise term. ($X[n]$ and $f(D[n])$ are known.) The result of this subtraction is given by:

$$[\text{Reduced noise}] \approx (V_{in}[n] - V^*_{in}[n])X[n]f(D[n]). \quad (32)$$

This result serves as a new input noise to the LPF. As long as $V^*_{in}[n]$ is a reasonably accurate approximation of $V_{in}[n]$, the reduced input noise in equation (32) will be much smaller than the original input noise of equation (31), and thus a larger bandwidth can be used for the LPF to accelerate the missing code length extraction.

The remaining problem is to create $V^*_{in}[n]$, which should meet two requirements: first, $V^*_{in}[n]$ should be a good estimate of $V_{in}[n]$; second, $V^*_{in}[n]$ must be independent of X[n], as otherwise, the reduced noise of (32) will contain a DC component, and will overlap with the LPF input signal at DC.

In the above-described acceleration method, a pivotal recognition is that $d_1$, the digital decision from the MSB, can serve as such an estimator, $V^*_{in}[n]$. Since $d_1$ is generated in the sampling phase while X[n] acts only in the charge transfer phase to select between the two operation modes, $d_1$ and X[n] are independent of each other, thus satisfying the second requirement above.

It can be checked how close an estimation $d_1$ is to $V_{in}[n]$. In a 1.5-bit-per-stage architecture, for instance, $d_1$ is the output of a 3-bit quantizer. Therefore, $V^*_{in}[n]$, formed as in the following equation as a scaled version of $d_1$, approximates $V_{in}[n]$ with a 3-bit accuracy:

$$V^*_{in}[n] = \begin{cases} -7V_{REF}/8 & [\text{for } d_1 = 000] \\ -5V_{REF}/8 & [\text{for } d_1 = 001] \\ -3V_{REF}/8 & [\text{for } d_1 = 010] \\ -V_{REF}/8 & [\text{for } d_1 = 011] \\ +V_{REF}/8 & [\text{for } d_1 = 100] \\ +3V_{REF}/8 & [\text{for } d_1 = 101] \\ +5V_{REF}/8 & [\text{for } d_1 = 110] \\ +7V_{REF}/8 & [\text{for } d_1 = 111] \end{cases} \quad (33)$$

With this $V^*_{in}[n]$, $|V_{in}[n]-V^*_{in}[n]| \leq V_{REF}/8$. Therefore, for $V_{in}[n]$ uniformly distributed across $[-V_{REF},+V_{REF}]$, the reduced noise power corresponding to (32) is smaller than the original noise power corresponding to (31) by a factor of 1/64. This reduction in the noise power allows for the use of a proportionally larger bandwidth for the LPF, leading to a substantial acceleration of the missing code length extraction.

In sum, methods and systems have been disclosed relating to dual-mode digital background calibration for pipelined ADCs.

It should be noted that various changes and modifications to the embodiments described herein will be apparent to those skilled in the art. Such changes and modifications may be made without departing from the spirit and scope of the present disclosure and without diminishing its attendant advantages.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

Nothing that has been stated or illustrated is intended to cause a dedication of any component, step, feature, object, benefit, advantage, or equivalent to the public.

What is claimed is:

1. A method of digital background calibration of a pipelined ADC, comprising:
   setting up a first operation mode for the pipelined ADC;
   setting up a second operation mode, different from the first operation mode, for the pipelined ADC;
   measuring a difference in the digital outputs between the first mode and the second mode so as to extract one or more missing code lengths of missing codes that appear in an input-output transfer curve of the pipelined ADC, and the curvature of the transfer curve; and
   removing errors resulting from the missing code lengths and the curvature.

2. The method of claim 1, wherein the act of extracting the missing code lengths comprise the acts of:
   randomly switching ADC operation between the first operation mode and the second operation mode; and
   correlating a resulting data sequence.

3. The method of claim 1, wherein the first operation mode uses a different set of reference voltages, compared to the second operation mode.

4. The method of claim 1, wherein the first operation mode connects to the split sub-capacitors in different way, or uses a different set of reference voltages, compared to the second operation mode.

5. The method of claim 1, wherein the missing code lengths result from collective effects of one of capacitor mismatches; gain insufficiency; and gain nonlinearity.

6. The method of claim 1, wherein the curvature of the transfer curve is indicative of ga in nonlinearity.

7. The method of claim 1, wherein the pipelined ADC comprises a multi-bit-per-stage pipelined ADC, and a 1.5 bit-per-stage pipelined ADC; and
   wherein the collective effects are taken into account only in the MSB stage of the pipelined ADC.

8. The method of claim 1, wherein the pipelined ADC comprises a multi-bit-per-stage pipelined ADC.

9. The method of claim 2, wherein the act of randomly switching ADC operation between the first operation mode and the second operation mode comprises using a pseudo-random variable X[n] that assumes a value +1 and a value −1 with equal probability, and choosing the first operation mode when X[n]=+1, and choosing the second operation mode when X[n]=−1.

10. A system for digital background calibration of a pipelined ADC, comprising:
    a pipelined ADC core;
    a random-number generator configured to select one of a first operating mode and a second operating mode, for the pipelined ADC core;
    circuitry configured to measure an averaged output difference between the two operating modes in each of a plurality of input regions;
    a coefficient estimation block configured to use the measured output differences to extract one or more missing code lengths and the curvature of the input-output transfer curve of the pipelined ADC; and
    a correction block configured to use the extracted missing code lengths and the extracted curvature to correct the output of the pipelined ADC.

11. The system of claim 10, wherein the missing code lengths result from collective effects of one of capacitor mismatches; insufficient amplifier gains; and gain nonlinearity; and wherein the curvature of the transfer curve is indicative of gain nonlinearity.

12. The system of claim 10,
wherein the pipelined ADC comprises one of: a 1-bit-per-stage pipelined ADC; a 1.5 bit-per-stage pipelined ADC; and a multi-bit-per-stage pipelined ADC.

13. The system of claim 10, wherein the random number generator is configured to randomly switching ADC operation between the first operation mode and the second operation mode by using a pseudo-random variable X[n] that assumes a value +1 and a value −1 with equal probability, and choosing the first operation mode when X[n]=+1, and choosing the second operation mode when X[n]=−1.

14. A method of digital background calibration of a pipelined ADC, comprising:
setting up a first operation mode for the pipelined ADC;
setting up a second operation mode, different from the first operation mode, for the pipelined ADC;
measuring a difference in the digital outputs between the first mode and the second mode so as to extract one or more missing code lengths of missing codes that appear in an input-output transfer curve of the pipelined ADC; and
removing the missing codes from the input-output transfer curve.

15. The method of claim 14, wherein the act of extracting the missing code lengths comprise the acts of:
randomly switching ADC operation between the first operation mode and the second operation mode; and
correlating a resulting data sequence.

16. The method of claim 14, wherein in the first operation mode the residue voltage $V_{RES}$ is related to the input voltage $V_{in}$ through a formula given by:

$$V_{RES,A} = \begin{cases} (2-\alpha)V_{in} + (1-\beta)V_{REF} & [d_1 = 00, 01] \\ (2-\alpha)V_{in} - (1-\beta)V_{REF} & [d_1 = 10, 11] \end{cases}. \quad (1)$$

17. The method of claim 14, wherein in the second operation mode, the residue voltage $V_{RES}$ is related to $V_{in}$ through a formula given by:

$$V_{RES,B} = \begin{cases} (2-\alpha)V_{in} + 2(1-\beta)V_{REF} & [d_1 = 00] \\ (2-\alpha)V_{in} & [d_1 = 01, 10] \\ (2-\alpha)V_{in} - 2(1-\beta)V_{REF} & [d_1 = 11] \end{cases}$$

wherein $V_{in}$ is the analog input voltage of the pipelined ADC;
$d_1$ is the MSB output of the pipelined ADC;
$V_{RES,A}$ is the residue voltage in the first operation mode;
$V_{RES,B}$ is the residue voltage in the second operation mode;
$V_{REF}$ is the reference voltage;
and
wherein $\alpha$ and $\beta$ are given by:

$\alpha \equiv \Delta + (4+2\Delta)/G$ $\beta \equiv \Delta + (2+\Delta)/G$ where $\Delta \equiv C_2/C_1 - 1$ represents a capacitance mismatch in the pipelined ADC, and G represents a finite gain of an operational amplifier in the pipelined ADC.

18. The method of claim 14, wherein the missing code lengths are given by $\beta V_{REF}$, and the magnitude of a difference in the digital outputs of the two operation modes is proportional to the missing code length $\beta V_{REF}$.

\* \* \* \* \*